US012720832B2

(12) United States Patent
Matsunaga

(10) Patent No.: US 12,720,832 B2
(45) Date of Patent: Aug. 25, 2026

(54) SILICON CARBIDE SEMICONDUCTOR DEVICE

(71) Applicant: FUJI ELECTRIC CO., LTD., Kawasaki (JP)

(72) Inventor: Shinichiro Matsunaga, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 382 days.

(21) Appl. No.: 18/425,881

(22) Filed: Jan. 29, 2024

(65) Prior Publication Data

US 2024/0297223 A1 Sep. 5, 2024

(30) Foreign Application Priority Data

Mar. 1, 2023 (JP) ................................ 2023-031442

(51) Int. Cl.
*H10D 62/832* (2025.01)
*H10D 30/60* (2025.01)
*H10D 62/10* (2025.01)
*H10D 64/27* (2025.01)

(52) U.S. Cl.
CPC ....... *H10D 62/8325* (2025.01); *H10D 30/615* (2025.01); *H10D 62/124* (2025.01); *H10D 64/512* (2025.01)

(58) Field of Classification Search
CPC ......................... H10D 62/8325; H10D 62/124
See application file for complete search history.

(56) References Cited

U.S. PATENT DOCUMENTS

2017/0141186 A1* 5/2017 Shiomi ................ H10D 62/109
2018/0033885 A1* 2/2018 Okumura ............. H10D 30/668
2018/0040690 A1 2/2018 Kobayashi et al.
2018/0342587 A1 11/2018 Okumura et al.
2019/0074372 A1* 3/2019 Kobayashi ........... H10D 30/668
2019/0081170 A1* 3/2019 Kumagai ............. H10D 84/035
2022/0285483 A1* 9/2022 Tsuji .................... H10D 30/668

FOREIGN PATENT DOCUMENTS

JP 6579104 B2 9/2019
JP 6802454 B2 12/2020
JP 7139678 B2 9/2022
JP 2022136715 A 9/2022

* cited by examiner

*Primary Examiner* — Ali Naraghi
(74) *Attorney, Agent, or Firm* — Rabin & Berdo, P.C.

(57) ABSTRACT

A silicon carbide semiconductor device includes first and second JFET regions between adjacent first and second $p^+$-type regions that are for mitigating electric field. The first $p^+$-type region directly beneath a trench extends closer to the second $p^+$-type region than is a sidewall of the trench by an overhang length. The second JFET region, provided between a p-type base region and the first JFET region, extends between the base region and the first $p^+$-type region to the sidewall of the trench. A thickness of the second JFET region is less than the overhang length of the first $p^+$-type region. A portion of the second JFET region sandwiched between the base region and the first $p^+$-type region has, in a cross-sectional view, a substantially square shape or a substantially rectangular shape elongated in a lateral direction. A lower end of a channel is blocked by the first and second $p^+$-type regions.

11 Claims, 6 Drawing Sheets

SILICON CARBIDE SEMICONDUCTOR DEVICE

CROSS REFERENCE TO RELATED APPLICATIONS

This application is based upon and claims the benefit of priority of the prior Japanese Patent Application No. 2023-031442, filed on Mar. 1, 2023, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, it is known that in a trench-gate silicon carbide (SiC) metal oxide semiconductor field effect transistor (MOSFET) containing SiC as a semiconductor material and having an insulated gate with a three-layer metal-oxide_film-semiconductor structure, a tradeoff between on-resistance and short-circuit withstand capability is improved by reducing a width of a junction FET (JFET) region, reducing an impurity concentration of the JFET region, and the like (for example, refer to Japanese Laid-Open Patent Publication No. 2022-136715, Japanese Patent No. 6579104, Japanese Patent No. 6802454, and Japanese Patent No. 7139678).

SUMMARY OF THE INVENTION

According to an embodiment of the present invention, a silicon carbide semiconductor device includes: a semiconductor substrate containing silicon carbide and having a first main surface and a second main surface opposite to each other; a first semiconductor region of a first conductivity type, provided in the semiconductor substrate; a second semiconductor region of a second conductivity type, provided between the first main surface of the semiconductor substrate and the first semiconductor region; a third semiconductor region of the first conductivity type, selectively provided between the first main surface and the second semiconductor region; a trench penetrating through the third semiconductor region and the second semiconductor region in a depth direction of the device; a gate electrode provided in the trench via a gate insulating film; a plurality of high-concentration regions of the second conductivity type, selectively provided between the second semiconductor region and the first semiconductor region, at positions closer to the second main surface than is a bottom of the trench, each of the plurality of high-concentration regions having an impurity concentration higher than an impurity concentration of the second semiconductor region, a bottom of each of the plurality of high-concentration regions being at a position closer to the second main surface than is a bottom of the trench; a junction field effect transistor (JFET) region of the first conductivity type, selectively provided between the second semiconductor region and the first semiconductor region, the JFET region being in contact with the first semiconductor region, the second semiconductor region, and the plurality of high-concentration regions, the JFET region having an impurity concentration higher than the impurity concentration of the first semiconductor region, a bottom of the JFET region being at a position closer to the second main surface than is the bottom of the trench; a first electrode electrically connected to the third semiconductor region, the second semiconductor region, and the plurality of high-concentration regions; and a second electrode provided at the second main surface. The plurality of high-concentration regions include: a first high-concentration region provided apart from the second semiconductor region and facing the bottom of the trench in the depth direction, and a second high-concentration region in contact with the second semiconductor region and provided apart from the trench and the first high-concentration region. The first high-concentration region extends closer to the second high-concentration region than is a sidewall of the trench in a direction parallel to the first main surface, by an overhang length. The JFET region includes: a first JFET region provided between and in contact with the first high-concentration region and the second high-concentration region that are adjacent to each other and apart from the sidewall of the trench, and a second JFET region provided between and in contact with the second semiconductor region and the first JFET region, the second JFET region extending from the first JFET region between the second semiconductor region and the first high-concentration region and reaching the sidewall of the trench. A thickness in the depth direction of the second JFET region is not more than the overhang length of the first high-concentration region.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
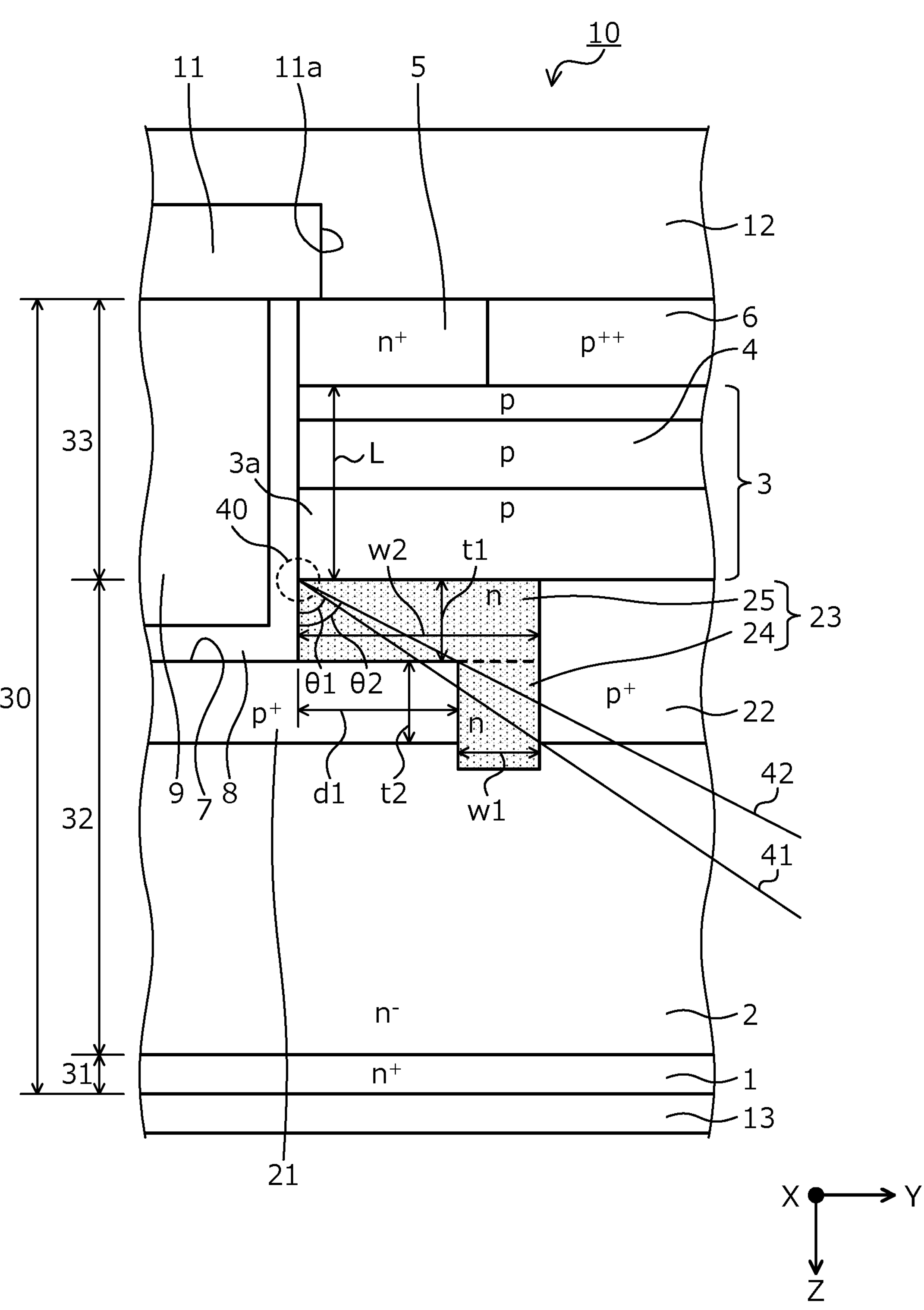
FIG. 1 is a cross-sectional view depicting a structure of a silicon carbide semiconductor device according to an embodiment.

First, problems associated with the conventional techniques are discussed. In Japanese Laid-Open Patent Publication No. 2022-136715, Japanese Patent No. 6579104, Japanese Patent No. 6802454, and Japanese Patent No. 7139678, when the impurity concentration of the JFET region is reduced excessively, the JFET resistance increases and the on-resistance increases, whereby the tradeoff between the on-resistance and the short-circuit withstand capability deteriorates. The JFET region is configured by an $n^-$-type drift region, or an n-type carrier storage (CS) layer, or an n-type current spreading layer (CSL) disposed between a p-type base region and the $n^-$-type drift region and the JFET region is an n-type region constituting a path of drift current.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described.

Figure 6:
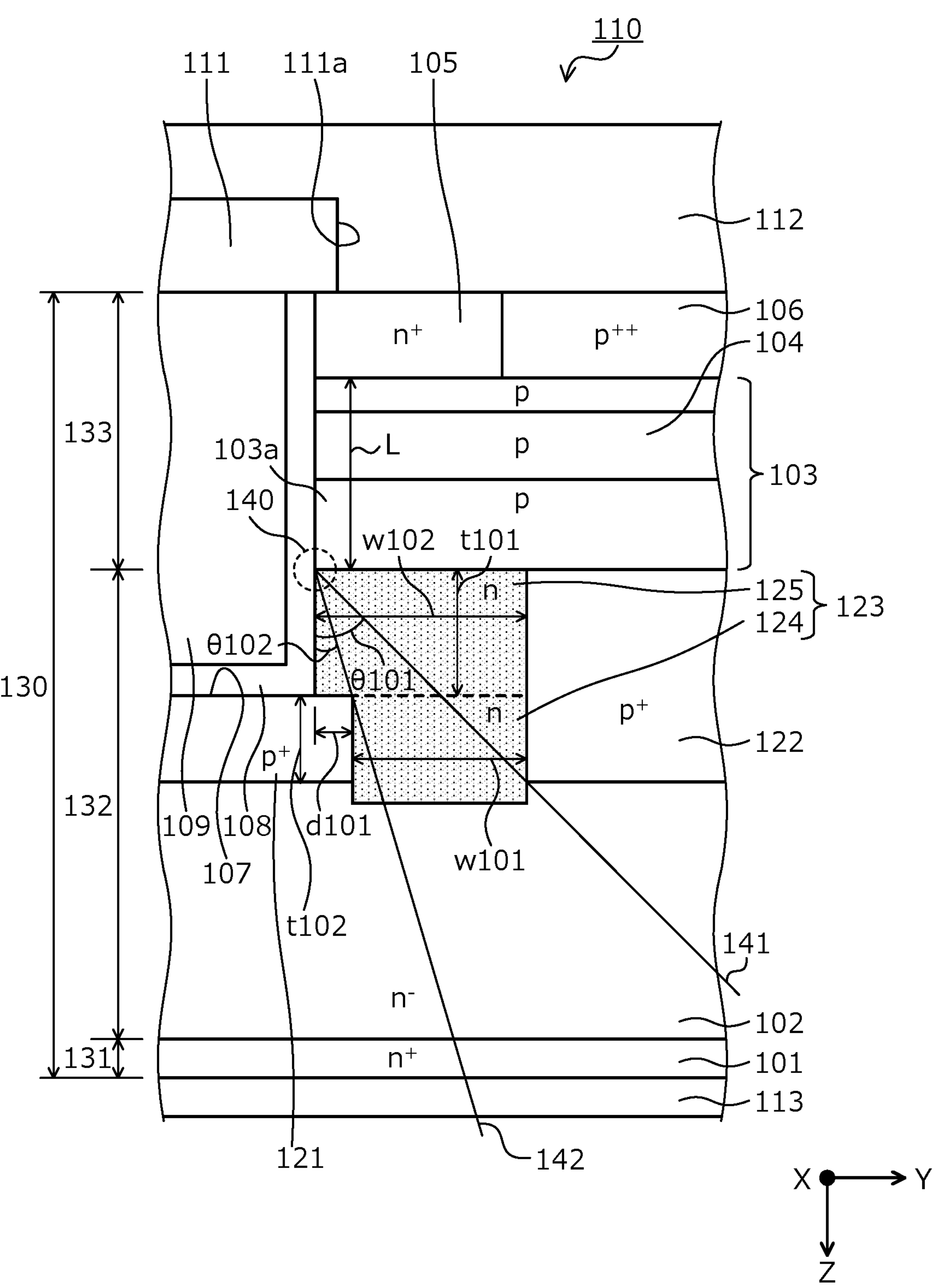
FIG. 6 is a cross-sectional view depicting a structure of a silicon carbide semiconductor device of a reference example.

First, an overview is given. A structure of a silicon carbide semiconductor device of a reference example containing silicon carbide (SiC) as a semiconductor material is described. FIG. 6 is a cross-sectional view depicting the structure of the silicon carbide semiconductor device of the reference example. In FIG. 6, while one unit cell (constituent unit of a device) is depicted by a ½ width, in a cross-sectional view of the device, the structure of the unit cell has line symmetry about a centerline (a non-depicted line that passes through a center of a trench 107 and is orthogonal to a front surface of a semiconductor substrate 130) of the trench 107. Further, a JFET region 123 is indicated by hatching. A silicon carbide semiconductor device 110 of the reference example depicted in FIG. 6 is a vertical SiC-MOSFET having, in the semiconductor substrate 130 containing SiC, a trench gate structure at a front surface (main surface having a p-type epitaxial layer 133) of the semiconductor substrate 130.

The semiconductor substrate 130 is formed by sequentially forming epitaxial layers 132, 133 by epitaxial growth on an $n^+$-type starting substrate 131 containing SiC; the epitaxial layers 132, 133 constitute an $n^-$-type drift region 102 and a p-type base region 103, respectively. The $n^+$-type starting substrate 131 constitutes an $n^+$-type drain region 101. The trench gate structure is configured by the p-type base region 103, an $n^+$-type source region 105, a $p^{++}$-type contact region 106, the trench 107, a gate insulating film 108, and a gate electrode 109. In the p-type base region 103, an implanted p-type channel region 104 is formed by a p-type impurity ion-implantation for adjusting gate threshold voltage.

The trench 107 extends linearly in a first direction X parallel to the front surface of the semiconductor substrate 130. Between the p-type base region 103 and the $n^-$-type drift region 102, at deep positions closer to the $n^+$-type drain region 101 than is a bottom of the trench 107, the $p^+$-type regions 121, 122, and the JFET region 123 are each selectively provided. The $p^+$-type regions 121, 122 are fixed to a potential of a source electrode 112 and have a function of mitigating electric field applied to the gate insulating film 108 at the bottom of the trench 107. The $p^+$-type regions 121, 122 extend linearly in a longitudinal direction (the first direction X) of the trench 107 and have substantially a same length as that of the trench 107.

The $p^+$-type region 121 is apart from the p-type base region 103 and faces the bottom of the trench 107 in a depth direction Z. The $p^+$-type region 122 is provided between the trench 107 and an adjacent trench 107 thereto, is in contact with the p-type base region 103, but apart from the trenches 107 and the $p^+$-type region 121. The JFET region 123 is formed by first and second FET regions 124, 125 that are adjacent to each other in the depth direction Z. The first JFET region 124 is an n-type region provided between and in contact with the $p^+$-type regions 121, 122, which are adjacent to each other. The first JFET region 124 has a lower surface (surface facing the $n^+$-type drain region 101) that is in contact with the $n^-$-type drift region 102.

The second JFET region 125 is an n-type region provided between the p-type base region 103 and the first JFET region 124. The second JFET region 125 has an upper surface (surface facing the $n^+$-type source region 105) that is in contact with the p-type base region 103, and a lower surface that is in contact with the first JFET region 124 and the $p^+$-type region 121. The second JFET region 125 is in contact with the $p^+$-type region 122 in a second direction Y (lateral direction of the trench 107) that is parallel to the front surface of the semiconductor substrate 130 and orthogonal to the first direction X. The second JFET region 125 is between the p-type base region 103 and the first JFET region 124, extends in the second direction Y from the $p^+$-type region 122 to each of the trenches 107 adjacent thereto, and is in contact with the gate insulating film 108 at the sidewall of each of the trenches 107 adjacent thereto. The second JFET region 125 has a thickness t101 of, for example, about 0.5 μm.

The source electrode 112, in a contact hole 111*a* of an interlayer insulating film 111, is in ohmic contact with the $n^+$-type source region 105 and the $p^{++}$-type contact region 106. A drain electrode 113 is in ohmic contract with an entire area of a back surface (main surface having the $n^+$-type starting substrate 131) of the semiconductor substrate 130. In the SIC-MOSFET, a channel width (dimension of a channel 103*a* in the first direction X) is increased without changing a channel length L (length of the channel 103*a* in the depth direction Z), whereby the on-resistance decreases and the short-circuit withstand capability also decreases. The channel 103*a* is an n-type inversion layer that becomes a path of drift current (a drain-source current Ids) formed in a portion of the p-type base region 103 along the sidewall of each of the trenches 107 when the MOSFET is on.

To enhance the short-circuit withstand capability, a width w101 of the first JFET region 124 in the second direction Y is reduced by extending both ends of the $p^+$-type region 121 to be closer to the $p^+$-type region 122 than are the sidewalls of the trench 107 directly above the $p^+$-type region 121, the impurity concentration of the JFET region 123 is reduced, or the like. As a result, the potential in a vicinity of the lower surface of the p-type base region 103 decreases and short-channel effects are suppressed, whereby a saturation current Isat decreases and short-circuit withstand capability increases. The short-circuit withstand capability is a capability to withstand short-circuit current. Short-circuit current is the drain-source current Ids that flows during load short-circuit, arm short-circuit, etc. and is a large current exceeding a rated current. The saturation current Isat is the drain-source current Ids in a saturation region (operating region in which a drain-source voltage Vds exceeds a pinch-off voltage Vp).

In the silicon carbide semiconductor device 110 of the reference example described, the inventor confirmed that when the impurity concentration of the second JFET region 125 is too low, the on-resistance increases, whereby the tradeoff relationship between the on-resistance and the short-circuit withstand capability degrades. Improvement of the tradeoff relationship between the on-resistance and the short-circuit withstand capability is given as one problem to be solved by the present embodiment. The inventor, as a result intensive research, found that by setting the thickness of the second JFET region to be not more than an overhang length of the $p^+$-type region for mitigating electric field and facing the bottom of the trench, the short-circuit withstand capability may be enhanced with the on-resistance maintained as it is and without lowering the impurity concentration of the second JFET region. The present embodiment is based on such findings.

A structure of a silicon carbide semiconductor device according to an embodiment is described. FIG. 1 is a cross-sectional view depicting the structure of the silicon carbide semiconductor device according to the embodiment. In FIG. 1, while one unit cell (constituent unit of a device) is depicted by a ½ width, in a cross-sectional view of the device, the structure of the unit cell has line symmetry about a centerline (a non-depicted line that passes through a center of a trench 7 and is orthogonal to a front surface of a semiconductor substrate 30) of the trench 7. Further, a JFET region 23 is indicated by hatching. A silicon carbide semiconductor device 10 according to the embodiment depicted in FIG. 1, is a vertical SiC-MOSFET having, in the semiconductor substrate (semiconductor chip) 30 at the front surface thereof, a trench gate structure provided in an active region; the semiconductor substrate 30 contains silicon carbide (SiC).

The active region is a region through which a drift current (the drain-source current Ids) flows in a direction orthogonal to the front surface of the semiconductor substrate 30 when the SiC-MOSFET (the silicon carbide semiconductor device 10) is on. In the active region, multiple unit cells each having a same structure of the SiC-MOSFET are disposed adjacently to one another. A periphery of the active region is surrounded by an edge termination region. The edge termination region is a region in which a predetermined voltage withstand structure (not depicted) is disposed and thus, has a function of mitigating electric field of a front side of the semiconductor substrate 30 and sustaining a breakdown voltage. The breakdown voltage is a voltage limit at which no malfunction or destruction of the silicon carbide semiconductor device 10 occurs with an operating voltage.

The semiconductor substrate 30 is formed by sequentially forming by epitaxial growth on a front surface of an $n^+$-type starting substrate 31 containing SiC, epitaxial layers 32, 33 constituting an $n^-$-type drift region (first semiconductor region) 2 and a p-type base region (second semiconductor region) 3, respectively. The semiconductor substrate 30 has, as the front surface, a first main surface having the p-type epitaxial layer 33 and, as a back surface, a second main surface having the $n^+$-type starting substrate 31. The $n^+$-type starting substrate 31 constitutes an $n^+$-type drain region 1. The trench gate structure is configured by the p-type base region 3, an $n^+$-type source region (third semiconductor region) 5, a $p^{++}$-type contact region 6, the trench 7, a gate insulating film 8, and a gate electrode 9.

The trench 7 penetrates through the p-type epitaxial layer 33 in the depth direction Z from the front surface of the semiconductor substrate 30 and terminates in the $n^-$-type epitaxial layer 32. The trench 7 extends linearly in the first direction X parallel to the front surface of the semiconductor substrate 30. As described above, multiple unit cells each having the same structure are disposed adjacently to one another, whereby the trench 7 and other trenches 7 of other unit cells extend in a striped pattern in the first direction X. A width of each of the trenches 7 in a lateral direction (the second direction Y) is, for example, about 0.7 μm. Along an inner wall of each of the trenches 7, the gate insulating film 8 is provided. In each of the trenches 7, the gate electrode 9 is provided on the gate insulating film 8.

The p-type base region 3, the $n^+$-type source region 5, and the $p^{++}$-type contact region 6 are provided between any adjacent two of the trenches 7. In the p-type epitaxial layer 33, a portion thereof excluding the $n^+$-type source region 5 and the $p^{++}$-type contact region 6 constitutes the p-type base region 3. The p-type base region 3 extends linearly in the first direction X to have substantially a same length as that of each of the trenches 7. The p-type base region 3 extends to the trenches 7 adjacent thereto in the second direction Y, which is parallel to the front surface of the semiconductor substrate 30 and orthogonal to the first direction X, and the p-type base region 3 is in contact with the gate insulating film 8 of each of the adjacent two of the trenches 7, at respective sidewalls of the trenches 7. Substantially the same length means the same length within a range that includes an allowable error due to process variation.

In a portion of the p-type base region 3 (including a later-described implanted p-type channel region 4), along the sidewalls of each of the trenches 7, a channel (n-type inversion layer) 3*a* is formed; the channel 3*a* constitutes a path of the drift current when the SiC-MOSFET is on. A channel width (dimension of the channel 3*a* in the first direction X) is increased without changing the channel length L (dimension of the channel 3*a* in the depth direction Z), whereby the on-resistance is reduced. An impurity concentration of the p-type base region 3 is, for example, on an order of $10^{17}/cm^3$. In the p-type base region 3, the implanted p-type channel region 4 is provided apart from the $n^+$-type source region 5, the $p^{++}$-type contact region 6, and the later-described JFET region 23.

The implanted p-type channel region 4 is a diffused region formed in the p-type epitaxial layer 33 by a p-type impurity ion-implantation of for adjusting the gate threshold voltage. The implanted p-type channel region 4 has a substantially uniform thickness in a direction parallel to the front surface of the semiconductor substrate 30, extends in an entire area of the p-type base region 3, and is in contact with the gate insulating film 8 of the trench 7, at the sidewall of the trench 7 adjacent thereto. A substantially uniform thickness means the same thickness within a range that includes an allowable error due to manufacturing process variation. An impurity concentration of the implanted p-type channel region 4 is higher than the impurity concentration of the p-type base region 3. The implanted p-type channel region 4 may be omitted.

The $n^+$-type source region 5 and the $p^{++}$-type contact region 6 are diffused regions formed by ion implantation performed to the p-type epitaxial layer 33. The $n^+$-type source region 5 and the $p^{++}$-type contact region 6 are each selectively provided between the front surface of the semiconductor substrate 30 and the p-type base region 3 and are in contact with the p-type base region 3. The $n^+$-type source region 5 and the $p^{++}$-type contact region 6 are exposed in a contact hole 11*a* of an interlayer insulating film 11. The $n^+$-type source region 5, at the sidewall of the trench 7 adjacent thereto, is in contact with the gate insulating film 8 of the trench 7. The $n^+$-type source region 5 is adjacent to the trench 7 and extends in the first direction X to have substantially a same length as that of the trench 7.

The $p^{++}$-type contact region 6 is provided in substantially a center between any adjacent two of the trenches 7 in the second direction Y, is apart from the trenches 7, and is adjacent to the $n^+$-type source region 5 in a direction parallel to the front surface of the semiconductor substrate 30. The $p^{++}$-type contact region 6, for example, is disposed at a predetermined pitch (predetermined interval) in the first direction X and a periphery thereof is surrounded by the $n^+$-type source region 5. The $p^{++}$-type contact region 6 may be omitted. In an instance in which the $p^{++}$-type contact region 6 is omitted, instead of the $p^{++}$-type contact region 6, the p-type base region 3 extends to the front surface of the semiconductor substrate 30 and is adjacent to the $n^+$-type source region 5 in a direction parallel to the front surface of the semiconductor substrate 30.

Between the p-type base region 3 and the $n^-$-type drift region 2, at positions closer to the $n^+$-type drain region 1 (back side of the semiconductor substrate 30) than are the bottoms of the trenches 7, $p^+$-type regions (high-concentration regions of a second conductivity type) 21, 22 and the JFET region 23 are each selectively provided. The $p^+$-type regions 21, 22 and the JFET region 23 are diffused regions formed by ion implantation performed in the $n^-$-type epitaxial layer 32. In the $n^-$-type epitaxial layer 32, a portion thereof excluding the $p^+$-type regions 21, 22 and the JFET region 23 constitutes the $n^-$-type drift region 2.

The $p^+$-type regions 21, 22 are fixed to a potential of a source electrode 12, deplete (or cause the JFET region 23 to deplete, or both) when the SiC-MOSFET is off, and have a function of mitigating electric field applied to the gate insulating films 8. The $p^+$-type regions 21, 22 extend linearly in the first direction X to have substantially a same length as that of the trenches 7. The $p^+$-type regions 21, 22 each terminates at a shallow position closer to the $n^+$-type source region 5 (closer to the front surface of the semiconductor substrate 30) than is the JFET region 23, and has a lower surface (surface facing the $n^+$-type drain region 1) in contact with the $n^-$-type drift region 2. The JFET region 23 may intervene between the $n^-$-type drift region 2 and the $p^+$-type regions 21, 22.

The $p^+$-type regions 21, 22 each may terminate at a position that is substantially a same depth as that of the JFET region 23 relative to the $n^+$-type drain region 1 or may terminate at a position closer to the $n^+$-type drain region 1 than is the JFET region 23. Substantially the same depth means the same depth within a range that includes an allowable error due to manufacturing process variation. All the $p^+$-type regions 21, 22 are electrically connected, for example, near a periphery of the active region. Any adjacent two of the $p^+$-type regions 21, 22, for example, may be partially connected in the active region by a $p^+$-type region (not depicted) between the adjacent two of the $p^+$-type regions 21, 22, the $p^+$-type region extending from said $p^+$-type region 21 to said $p^+$-type region 22 in the second direction Y.

The $p^+$-type regions 21, 22 may each have, in a cross-sectional view of the device, a substantially rectangular shape having a width that is substantially a same as that of an opening of an ion-implantation mask and corners (vertices) that are substantially right angles, or a substantially rectangular shape having rounded corners with a predetermined curvature by diffusing impurities radially from a depth position of the range of the ion implantation. A corner of any one of the $p^+$-type regions 21 is an upper corner (border between an upper surface and a side surface (intersection)) of the $p^+$-type region 21 and is a lower corner (border between a lower surface and a side surface (intersection)) of the $p^+$-type region 21. A corner of any one of the $p^+$-type regions 22 is a lower corner of the $p^+$-type region 22.

Each of the $p^+$-type regions (first high-concentration regions) 21 is provided apart from the p-type base region 3 and faces the bottom and bottom corners (border between the bottom and the sidewalls) of a corresponding one of the trenches 7 in the depth direction Z. The $p^+$-type region 21 is in contact with the gate insulating film 8 of the corresponding one of the trenches 7, at the bottom and bottom corners the corresponding one of the trenches 7. An upper surface (surface facing the $n^+$-type source region 5) of the $p^+$-type region 21 may reach a shallow depth position closer to the $n^+$-type source region 5 than is the bottom of the corresponding one of the trenches 7. In this instance, the $p^+$-type region 2 is in contact with the gate insulating film 8 at the sidewalls and the bottom of corresponding one of the trenches 7. For each of the $p^+$-type regions 21, a depth position of an upper surface thereof is set, for example, according to the depth position of the bottom of the trench 7 or a thickness t1 of a later-described second JFET region 25.

Each of the $p^+$-type regions 21 has a width in the second direction Y wider than a width of each of the trenches 7 in the second direction Y. Ends of the $p^+$-type region 21 in the second direction Y extend beyond the sidewalls of the trench 7 directly above (direction to the $n^+$-type source region 5), the ends of the $p^+$-type region 21 extending in the second direction Y toward the $p^+$-type regions 22 adjacent thereto. A length (hereinafter, "overhang length") d1 of the $p^+$-type region 21 from a portion thereof closest to one of the adjacent $p^+$-type regions 22 to a closest one of the sidewalls of the trench 7 directly above may be, for example, in a range of 0.25 μm to 0.4 μm or preferably may be about 0.3 μm±10% (i.e., a range of about 0.27 μm to 0.33 μm).

The numeric range of the overhang length d1 of the $p^+$-type regions 21 described above corresponds to substantially a same length as that of an opening width of an ion implantation mask for forming the $p^+$-type regions 21. Diffusion of impurities in SiC is difficult. Therefore, while diffused regions with a width substantially the same as the opening width of the ion implantation mask are formed in the SiC, the numeric range of the overhang length d1 of the $p^+$-type regions 21 may be shifted toward the upper limit by an amount corresponding to lateral diffusion of the impurity (diffusion in a direction parallel to the ion implantation surface), or may be shifted toward the lower limit or the upper limit by a difference in the impurity amount relative to that of the first JFET region 24 adjacent thereto in the second direction Y.

The longer the overhang length d1 of the $p^+$-type regions 21 is set, the greater the short-channel effects may be suppressed and the greater the saturation current Isat (the drain-source current Ids in the saturation region) may be reduced, with the on-resistance being maintained as it is (refer to later-described FIGS. 4 and 5). The greater the saturation current Isat is reduced, the closer output characteristics (Ids-Vds characteristics, refer to FIG. 4) in the saturation region may be made nearly flat. Meanwhile, the longer the overhang length d1 of the $p^+$-type regions 21 is set, the wider the cell pitch becomes. Therefore, for example, a width of each of the $p^+$-type regions 22 in the second direction Y may be decreased by the overhang length d1 of the $p^+$-type regions 21, whereby the cell pitch may be maintained.

A total impurity concentration of the $p^+$-type regions 21 may be increased to an extent that, when pn junctions that the $p^+$-type regions 21 form with the JFET region 23 are reverse biased, vicinities near the bottoms of the trenches 7 do not deplete, a box profile thereof is formed, or an impurity concentration profile is formed in which a peak concentration (highest value) is at a predetermined location. Further, when an impurity concentration of the $p^+$-type regions 21 is excessively high, crystal defects are generated by the ion implantation for forming the $p^+$-type regions 21. Therefore, the impurity concentration of the $p^+$-type regions 21 is set low to an extent that no crystal defects occur due to the ion implantation and is in a range, for example, of about $5\times10^{17}/cm^3$ to less than $1\times10^{19}/cm^3$.

Further, the impurity concentration of the $p^+$-type regions 21 and the impurity concentration profile thereof may be preferably set so that a width (i.e., thickness of a non-depleted portion of the second JFET region 25) of the path of the drift current in the second JFET region 25 decreases due to a depletion layer that spreads in the JFET region 23 (in particular, in the later-described second JFET region 25) from the pn junctions that the $p^+$-type regions 21 form with the JFET region 23. Thus, the impurity concentration of the $p^+$-type regions 21 and the impurity concentration profile thereof are suitably set according to the impurity concentration of the second JFET region 25 and a thickness t2 of each of the $p^+$-type regions 21. The thickness t2 of each of the $p^+$-type regions 21 is in a range of, for example, about 0.3 μm to 0.4 μm.

The $p^+$-type regions (second high-concentration regions) 22 are each provided between any adjacent two of the trenches 7 and each is apart from the trenches 7 and the $p^+$-type regions 21. The $p^+$-type regions 22 each has an upper surface in contact with the p-type base region 3 and faces the $p^{++}$-type contact region 6 in the depth direction Z. The width of each of the $p^+$-type regions 22 in the second direction Y is suitably set according to the cell pitch, the overhang length d1 of the $p^+$-type regions 21 and the width w1 of the later-described first JFET region 24 in the second direction Y. The width of each of the $p^+$-type regions 22 in the second direction Y may be at least equal to a width of the $p^{++}$-type contact region 6 in the second direction Y or may be less than the width of the $p^{++}$-type contact region 6 in the second direction Y.

Further, each of the $p^+$-type regions 22, for example, is divided into two portions including a lower portion (portion facing the $n^+$-type drain region 1) and an upper portion (portion facing the $n^+$-type source region 5) formed by a multistage epitaxial method. The multistage epitaxial method is a method of dividing formation of an epitaxial layer into multiple sessions of epitaxial growth and in each epitaxially grown sublayer, selectively forming diffused regions by ion implantation so as to be adjacent with other diffused regions of the same conductivity type in the depth direction Z. The lower portions of the $p^+$-type regions 22, for example, are formed concurrently with the $p^+$-type regions 21. The impurity concentration of the upper portions and the impurity concentration of the lower portions of the $p^+$-type regions 22 may be substantially the same or may be different from each other.

The JFET region 23, between the channel 3*a* and the $n^-$-type drift region 2, is adjacent to the channel 3*a* and is an n-type region constituting the path of the drift current when the SiC-MOSFET is on. The JFET region 23 has an impurity concentration higher than that of the $n^-$-type drift region 2 and a function of reducing JFET resistance. Further, the JFET region 23 functions as a so-called current spreading layer (CSL) that reduces carrier spreading resistance. The JFET region 23, for example, is divided into two portions including a lower portion (first JFET region) 24 and an upper portion (second JFET region) 25 and is formed by the multistage epitaxial method.

The impurity concentration of the first and second regions 24, 25 is within a range, for example, about $5.0\times10^{16}/cm^3$ to $1.6\times10^{17}/cm^3$ and preferably may be within a range of about $8.0\times10^{16}/cm^3$ to $1.5\times10^{17}/cm^3$. The first and second regions 24, 25 may have substantially a same impurity concentration. Substantially the same impurity concentration means the same impurity concentration within a range that includes an allowable error due to manufacturing process variation. The first JFET region 24 is an n-type region provided between and in contact with the $p^+$-type regions 21, 22 that are adjacent to each other. The first JFET region 24 has a lower surface in contact with the $n^-$-type drift region 2. The first JFET region 24 has an upper surface positioned at substantially a same depth as an upper surface of each of the $p^+$-type regions 21.

The width w1 of the first JFET region 24 in the second direction Y is suitably set to satisfy later-described expression (1). For example, the narrower is the width w1 of the first JFET region 24 in the second direction Y, the narrower the cell pitch may be set and thus, the number of unit cells disposed adjacent to one another and connected in parallel in the active region may be increased, chip size may be reduced, etc. On the other hand, the narrower is the width w1 of the first JFET region 24 in the second direction Y, the greater is the JFET resistance and the greater is the on-resistance. Therefore, the width w1 of the first JFET region 24 in the second direction Y may be preferably increased to an extent that a predetermined JFET resistance is maintainable.

The second JFET region 25 is an n-type region provided between the p-type base region 3 and the first JFET region 24. The second JFET region 25 has an upper surface in contact with the p-type base region 3 and a lower surface in contact with the first JFET region 24 and the $p^+$-type region 21. The second JFET region 25 is in contact with the $p^+$-type region 22 in the second direction Y. The second JFET region 25 spans between the p-type base region 3 and the first JFET region 24 in the second direction Y from the $p^+$-type region 22 to the trench 7 and is in contact with the gate insulating film 8 at the sidewall of the trench 7 adjacent thereto. The upper surface of the second JFET region 25 is positioned at substantially a same depth as that of the upper surface of the $p^+$-type region 22. The on-resistance is dependent on and determined by the impurity concentration of the second JFET region 25.

For example, the impurity concentration of the second JFET region 25 is suitably set so that, during relatively low conduction when the drain-source voltage Vds is, for example, about 5V, the JFET region 23 does not easily deplete and increases in the on-resistance are suppressed. As a result, in a linear region, the drain-source voltage Vds rises and until the drain-source voltage Vds reaches the pinch-off voltage Vp, the drain-source current Ids increases by a predetermined on-resistance (slope of output characteristics). Further, the impurity concentration of the second JFET region 25 is suitably set so that, when the drain-source voltage Vds is, for example, 100V or higher, depletion of the second JFET region 25 progresses, and the width of the path of the drain-source current Ids in the second JFET region 25 decreases.

The impurity concentration of the second JFET region 25 is suitably set and a depletion layer spreads in the second JFET region 25 from the pn junctions between the $p^+$-type regions 21, 22 and the second JFET region 25, whereby the width of the path of the drain-source current Ids in the second JFET region 25 is reduced and thus, the path of the drain-source current Ids in the second JFET region 25 becomes longer. As a result, for example, during blocking when the SiC-MOSFET is transitioning from on to off, even when the drain-source voltage Vds becomes a high voltage of 100V or greater due to load short-circuit or arm short-circuit, voltage drop in the second JFET region 25 due to the drain-source current Ids is large, and increases in potential of a lower end 40 of the channel 3*a* are suppressed.

The thickness t1 of the second JFET region 25 is not more than the overhang length d1 of the $p^+$-type regions 21 ($t1/d1 \leq 0$). In other words, in a cross-sectional view of the device, a portion of the second JFET region 25 sandwiched between the p-type base region 3 and the $p^+$-type region 21 has a substantially square shape or a substantially rectangular shape elongated in the second direction Y ($\theta 2 \geq 45$ degrees). As a result, the lower end (end facing the $n^+$-type drain region 1) 40 of the channel 3*a*, in the linear region (operating region where the drain-source voltage Vds is not more than the pinch-off voltage Vp), is not visible in a linear line of sight from a drain electrode 13. The lower end 40 of the channel 3*a* not being visible in a linear line of sight from the drain electrode 13 means that no portion exists where the lower end 40 of the channel 3*a* and the drain electrode 13 face each other across only an n-type region (the JFET region 23, the $n^-$-type drift region 2, and the $n^+$-type drain region 1).

In particular, the lower end 40 of the channel 3*a* not being visible in a linear line of sight from the drain electrode 13 means that on each line segment (line segment connecting the lower end 40 of the channel 3*a* and the drain electrode 13, for example, first and second line segments 41, 42 in FIG. 1) connecting an arbitrary point on the lower end 40 of the channel 3*a* and an arbitrary point on an interface between the drain electrode 13 and the $n^+$-type drain region 1, one of or both the $p^+$-type regions 21, 22 is/are positioned on the line segment so as to divide the line segment. When the line of sight is from any arbitrary point on the interface between the drain electrode 13 and the $n^+$-type drain region 1, the lower end 40 of the channel 3*a* and the drain electrode 13 face each other across at least one of the $p^+$-type regions 21, 22. As a result, the lower end 40 of the channel 3*a* is blocked by at least one of the $p^+$-type regions 21, 22 and electric field generated in the $n^-$-type drift region 2 by the drain-source voltage Vds is not directly applied to the lower end 40 of the channel 3*a*.

The lower end 40 of the channel 3*a* not being visible in a linear line of sight from the drain electrode 13 means that the lower end 40 of the channel 3*a* and the drain electrode 13 may face each other across a depletion layer that spreads in the JFET region 23 from the pn junctions between the $p^+$-type regions 21, 22 and the JFET region 23. In other words, when the line of sight is from any arbitrary point on the interface between the drain electrode 13 and the $n^+$-type drain region 1, the lower end 40 of the channel 3*a* is blocked by at least one of the $p^+$-type regions 21, 22 and/or said depletion layer, whereby the lower end 40 of the channel 3*a* may not be visible in a linear line of sight from the drain electrode 13. In this instance, no portion exists where the lower end 40 of the channel 3*a* and the drain electrode 13 face each other across only a non-depleted portion of an n-type region (a non-depleted portion of the JFET region 23, a non-depleted portion of the $n^-$-type drift region 2, and/or a non-depleted portion of the $n^+$-type drain region 1).

For example, in the reference example structure (refer to FIG. 6), a portion of the second JFET region 125 sandwiched between the p-type base region 103 and the $p^+$-type region 121 has a substantially rectangular shape elongated in the depth direction Z, in a cross-sectional view of the device. Between the $p^+$-type regions 121, 122 that are adjacent to each other, a portion (portion sandwiched between first and second line segments 141, 142 in FIG. 6) where a lower end 140 of the channel 103*a* faces the drain electrode 113 across only an n-type region (the JFET region 123, the $n^-$-type drift region 102, and the $n^+$-type drain region 101) is present and has a relatively large width. In the portion, the lower end 140 of the channel 103*a* is visible in a linear line of sight from the drain electrode 113 and electric field generated in the $n^-$-type drift region 102 by the drain-source voltage Vds is applied directly to the lower end 140 of the channel 103*a*, whereby the potential of the lower end 140 of the channel 103*a* is presumed to increase.

In the embodiment, the lower end 40 of the channel 3*a* is not visible in a linear line of sight from the drain electrode 13, whereby electric field generated in the $n^-$-type drift region 2 by the drain-source voltage Vds is not applied directly to the lower end 40 of the channel 3*a* and thus, as compared to the reference example structure, increases in the potential of the lower end 40 of the channel 3*a* are presumed to be suppressed. As a result, depletion of the lower end 40 of the channel 3*a* is inhibited and short-channel effects are suppressed. The thickness t1 of the second JFET region 25 is assumed to be less than the overhang length d1 of the $p^+$-type regions 21 ($t1/d1<0$) and in a cross-sectional view of the device, in the second direction Y, the longer is the substantially rectangular shape of the portion of the second JFET region 25 sandwiched between the p-type base region 3 and the $p^+$-type region 21, the longer is the path of the drift current in the second JFET region 25 and the greater are voltage drops in the second JFET region 25 due to drift current.

In a cross-sectional view of the device, to make the substantially rectangular shape elongated in the second direction Y or the substantially square shape of the portion of the second JFET region 25 sandwiched between the p-type base region 3 and the $p^+$-type regions 21, for example, the thickness t1 of the second JFET region 25 may be reduced and the overhang length d1 of the $p^+$-type regions 21 may be increased. The greater the thickness t1 of the second JFET region 25 is reduced, the greater the short-channel effects may be suppressed and the smaller the saturation current Isat may be set while maintaining the on-resistance as it is (refer to later-described FIGS. 2 and 3). The greater the saturation current Isat is reduced, the closer output characteristics (Ids-Vds characteristics, refer to FIG. 2) in the saturation region may be made nearly flat. The longer is the overhang length d1 of the $p^+$-type regions 21, the higher is the effect of suppressing the short-channel effects (refer to FIG. 5).

When the thickness t1 of the second JFET region 25 is reduced excessively, the on-resistance becomes excessively high, and the tradeoff relationship between the on-resistance and the short-circuit withstand capability degrades. Further, the thickness t1 of the second JFET region 25 corresponds to the thickness of an epitaxial layer of one stage when the JFET region 23 is formed using the multistage epitaxial method and the thinner is the thickness, the greater is the variation of the thickness within the surface of the semiconductor substrate 30. The greater is the thickness t1 of the second JFET region 25, the lower is the suppression of the short-channel effects. Therefore, the thickness t1 of the second JFET region 25 may be, for example, within a range of about 0.25 μm to 0.4 μm or preferably, may be about 0.3 μm±10%.

Further, even by suitably setting the thickness t1 of the second JFET region 25, the thickness t2 of each of the $p^+$-type regions 21, the overhang length d1 of the $p^+$-type regions 21, and the width w1 of the first JFET region 24 in the second direction Y so that expression (1) described below is satisfied, the lower end 40 of the channel 3*a* is not visible in a linear line of sight from the drain electrode 13. FIG. 1 depicts an instance in which, in a cross-sectional view of the device, the $p^+$-type regions 21, 22 have substantially rectangular shape with corners that are substantially right angles. While expression (1) described below is a conditional expression for an instance in which the $p^+$-type regions 21, 22 have, in a cross-sectional view of the device, substantially rectangular shapes with corners that are substantially right angles, this is synonymous with θ2>θ1 and thus, is satisfied even in an instance in which, in a cross-sectional view of the device, the $p^+$-type regions 21, 22 have substantially rectangular shapes with rounded corners.

$$\arctan[(d1+w1)/(t1+t2)]<\arctan(d1/t1) \quad (1)$$

In particular, for example, in the reference example structure (refer to FIG. 6), between the $p^+$-type regions 121, 122 that are adjacent to each other, a second angle θ102 formed by the sidewall of the trench 107 and a second line segment 142 connecting an arbitrary point on the lower end 140 of the channel 103*a* and an arbitrary point on an upper corner (intersection of an upper surface and side surface) of the $p^+$-type region 121, is smaller than a first angle θ101 formed by the sidewall of the trench 107 and the first line segment 141 connecting an arbitrary point on the lower end 140 of the channel 103*a* and an arbitrary point on a lower corner (intersection of a bottom surface and side surface) of the $p^+$-type region 122 (θ102<θ101). Thus, the $p^+$-type regions 121, 122 are not positioned between the first and second line segments 141, 142 each having an end point that is the same arbitrary point on the lower end 140 of the channel 103*a*; and between the first and second line segments 141, 142, the lower end 140 of the channel 103*a* is visible in a linear line of sight from the drain electrode 113. FIG. 6 depicts an instance in which, in a cross-sectional view of the device, the $p^+$-type regions 121, 122 have substantially rectangular shapes with corners having substantially right angles.

On the other hand, in the present embodiment, in an instance in which, in a cross-sectional view of the device, the $p^+$-type regions 21, 22 have a substantially rectangular shape with corners having a right angle, and expression (1) described above is satisfied. Between the $p^+$-type regions 21, 22 that are adjacent to each other, a second angle θ2 formed by the sidewall of the trench 7 and a second line segment 42 connecting the arbitrary point on the lower end 40 of the channel 3*a* and an arbitrary point on an upper corner of the $p^+$-type region 21 (intersection of an upper surface and a side surface) is greater than a first angle θ1 formed by the sidewall of the trench 7 and a first line segment 41 connecting the arbitrary point on the lower end 40 of the channel 3*a* and an arbitrary point on the lower corner of the $p^+$-type region 22 (intersection of an upper surface and a side surface) (θ2>θ1). As a result, between the first and second line segments 41, 42 having the same arbitrary point on the lower end 40 of the channel 3*a* as an end point, the $p^+$-type regions 21, 22 intervene between the lower end 40 of the channel 3*a* and the drain electrode 13, whereby the lower end 40 of the channel 3*a* is blocked by the $p^+$-type regions 21, 22 and not visible in a linear line of sight from the drain electrode 13.

In an instance in which, in a cross-sectional view of the device, the $p^+$-type regions 21, 22 each has a substantially rectangular shape having rounded corners, a tangent in contact with any one of the $p^+$-type regions 21 at an arbitrary point on the curved surface of a lower corner of the lower corner of the $p^+$-type region 22 and passing through the arbitrary point on the lower end 40 of the channel 3*a* constitutes the first line segment 41. A tangent in contact with any one of the $p^+$-type regions 21 at an arbitrary point on the curved surface of the upper corner of the $p^+$-type region 21 and passing through the arbitrary point on the lower end 40 of the channel 3*a* constitutes the second line segment 42. Therefore, as compared to an instance in which the corners of the $p^+$-type region 22 are substantially right angles, with the arbitrary point on the lower end 40 of the channel 3*a* as a center, the first line segment 41 is rotated in a direction such that the first angle θ1 increases by the amount that the lower corner of the $p^+$-type region 22 is rounded. As compared to an instance in which the corners of the $p^+$-type region 21 are substantially right angles, with the arbitrary point on the lower end 40 of the channel 3*a* as a center, the second line segment 42 is rotated in a direction such that the second angle θ2 decreases by an amount that the upper corner of the $p^+$-type region 21 is rounded.

As described, in an instance in which the corners of the $p^+$-type regions 21, 22 are rounded, as compared to an instance in which the corners of the $p^+$-type regions 21, 22 are substantially right angles, the first and second line segments 41, 42 having the same arbitrary point on the lower end 40 of the channel 3*a* as an end point are rotated to be closer to each other. In this instance as well, the thickness t1 of the second JFET region 25, the thickness t2 of each of the $p^+$-type regions 21, the overhang length d1 of the $p^+$-type regions 21, and the width w1 of the first JFET region 24 in the second direction Y are suitably set so that the second angle θ2 is larger than the first angle θ1 (θ2>θ1), whereby configuration is such that between the first and second line segments 41, 42 having the same arbitrary point on the lower end 40 of the channel 3*a* as an end point, the $p^+$-type regions 21, 22 intervene between the lower end 40 of the channel 3*a* and the drain electrode 13. Thus, similar to an instance in which the corners of the $p^+$-type regions 21, 22 are substantially right angles, the lower end 40 of the channel 3*a* is not visible in a linear line of sight from the drain electrode 13.

The interlayer insulating film 11 is provided in an entire area of the front surface of the semiconductor substrate 30 and covers the gate electrodes 9. The source electrode (first electrode) 12 is in ohmic contact with the $n^+$-type source region 5 and the $p^{++}$-type contact region 6 via the contact hole 11*a* and is electrically connected to the $n^+$-type source region 5, the $p^{++}$-type contact region 6, the p-type base region 3, and the $p^+$-type regions 21, 22. A drain electrode (second electrode) 13 is provided in an entire area of a back surface (back surface of the $n^+$-type starting substrate 31) of the semiconductor substrate 30. The drain electrode 13 is in ohmic contact with the $n^+$-type drain region 1 (the $n^+$-type starting substrate 31) and is electrically connected to the $n^+$-type drain region 1.

Operation of the silicon carbide semiconductor device 10 according to the embodiment (SiC-MOSFET) is described. During normal operation of the SiC-MOSFET, when voltage (the drain-source voltage Vds) that is positive with respect to the source electrode 12 is applied to the drain electrode 13, pn junctions (main junctions of the active region) between the $p^{++}$-type contact region 6, the p-type base region 3, the $p^+$-type regions 21, 22, the JFET region 23, the $n^-$-type drift region 2, and the $n^+$-type drain region 1 are reverse biased. In this state, when the voltage applied to the gate electrode 9 is less than the gate threshold voltage, the SiC-MOSFET maintains the off-state.

On the other hand, when voltage that is positive with respect to the source electrode 12 is applied to the drain electrode 13 and gate voltage at least equal to the gate threshold voltage is applied to the gate electrode 9, the channel 3*a* is formed in a portion of the p-type base region 3 along the sidewall of the trench 7. As a result, drift current (the drain-source current Ids) flows from the $n^+$-type drain region 1, through the $n^-$-type drift region 2, the JFET region 23, and the channel 3$a$ and to the $n^+$-type source region 5, whereby the SiC-MOSFET turns on (conducts). In a linear region, the drain-source current Ids is large until the drain-source voltage Vds increases and reaches the pinch-off voltage Vp.

In the saturation region, the drain-source current Ids (the saturation current Isat) may be substantially saturated by a small current value. A reason for this is that the lower end 40 of the channel 3$a$ is shielded by a depletion layer that spreads from the main junctions of the active region, the $p^+$-type regions 21, or the $p^+$-type regions 22 and is not visible in a linear line of sight from the drain electrode 13. The lower end 40 of the channel 3$a$ is not visible in a linear line of sight from the drain electrode 13, whereby electric field generated in the $n^-$-type drift region 2 by the drain-source voltage Vds is not applied directly to the lower end 40 of the channel 3$a$. As a result, increases in the potential of the lower end 40 of the channel 3$a$ are suppressed.

Increases in the potential of the lower end 40 of the channel 3$a$ are suppressed, whereby even when the drain-source voltage Vds becomes high, depletion of the lower end 40 of the channel 3$a$ becomes difficult. Thus, a pinch-off point (the lower end 40 of the channel 3$a$) of the channel 3$a$ does not move easily and the effective channel length L may be maintained at a length about equal to the thickness of the p-type base region 3, whereby the short-channel effects may be suppressed. As a result, even when the drain-source voltage Vds becomes high, the saturation current Isat does not easily increase, and output characteristics in the saturation region may be made nearly flat.

In the reference example structure, the lower end 140 of the channel 103$a$ is visible in a linear line of sight from the drain electrode 113, whereby electric field generated in the $n^-$-type drift region 102 by the drain-source voltage Vds is applied directly to the lower end 140 of the channel 103$a$. As a result, increases in the potential of the lower end 140 of the channel 103$a$ are large and depletion of the lower end 140 of the channel 103$a$ is facilitated. The higher is the drain-source voltage Vds, the greater is the movement of the pinch-off point (the lower end 140 of the channel 103$a$) of the channel 103$a$ in a direction to the $n^+$-type source region 5 and the shorter is the effective channel length L. Therefore, the higher is the drain-source voltage Vds, the greater is the saturation current Isat due to short-channel effects.

In general, in the MOSFET, when off-operation is delayed and the MOSFET remains on during load short-circuit or during arm short-circuit, the drain-source voltage Vds and the drain-source current Ids are concurrently applied and the temperature suddenly rises. Similar to the reference example structure, in an instance in which the saturation current Isat increases accompanying an increase in the drain-source voltage Vds, when the drain-source voltage Vds becomes high (for example, 1200V) during load short-circuit or during arm short-circuit, the drain-source current Ids becomes a large current (short-circuit current) exceeding the rated current and the temperature of the SiC-MOSFET rapidly increases leading to thermal destruction.

In the embodiment, as described above, even when the drain-source voltage Vds increases, the saturation current Isat does not easily increase. Thus, even when the drain-source voltage Vds becomes large during load short-circuit or during arm short-circuit, short-circuit current does not easily flow and the short-circuit withstand capability may be enhanced. The impurity concentration of the second JFET region 25 is suitably set, whereby the tradeoff relationship between the on-resistance and the short-circuit withstand capability is improved.

As described, according to the embodiment, the thickness of the second JFET region is set to be not more than the overhang length of the $p^+$-type region that is for mitigating electric field and faces the bottom of the trench. As a result, the structure is such that the lower end of the channel is not visible in a linear line of view from the drain electrode and increases in the potential of the lower ends of the channel are suppressed. As a result, with the on-resistance maintained as is, the short-channel effects are suppressed and the saturation current may be reduced. The smaller is the saturation current, the closer the output characteristics in the saturation region may be set to being nearly flat. Thus, even when the drain-source voltage increases during load short-circuit or during arm short-circuit, short-circuit current does not easily flow and the short-circuit withstand capability is enhanced. Therefore, the tradeoff relationship between the on-resistance and the short-circuit withstand capability may be improved.

Further, according to the embodiment, the greater the thickness of the second JFET region is reduced and the longer is the overhang length of the $p^+$-type region that is for mitigating electric field and faces the bottom of the trench is set, the higher is the effect of suppressing the short-channel effects. Further, increases in the potential of the overall lower end of the channel are suppressed, whereby the short-circuit withstand capability does not decrease even when the channel width increases and the on-resistance is reduced.

Figure 2:
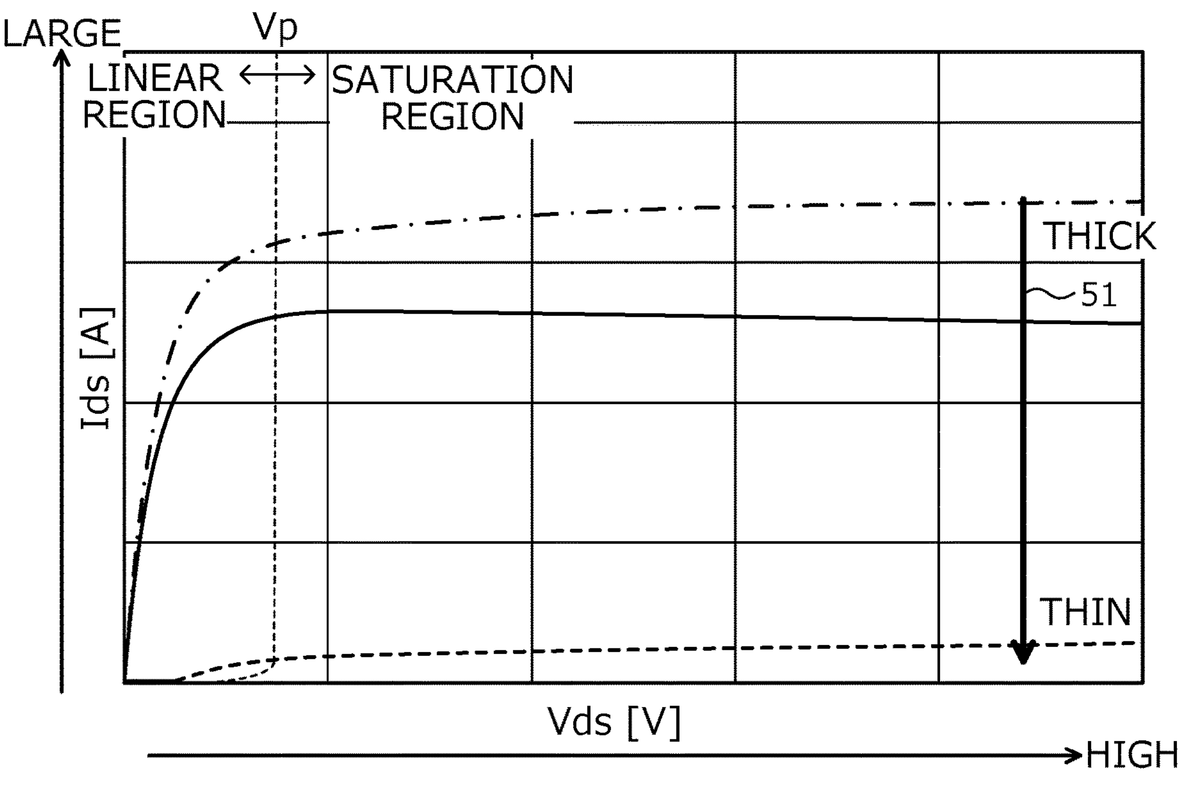
FIG. 2 is a characteristics diagram depicting output characteristics of first, second, and third comparison examples.
Figure 3:
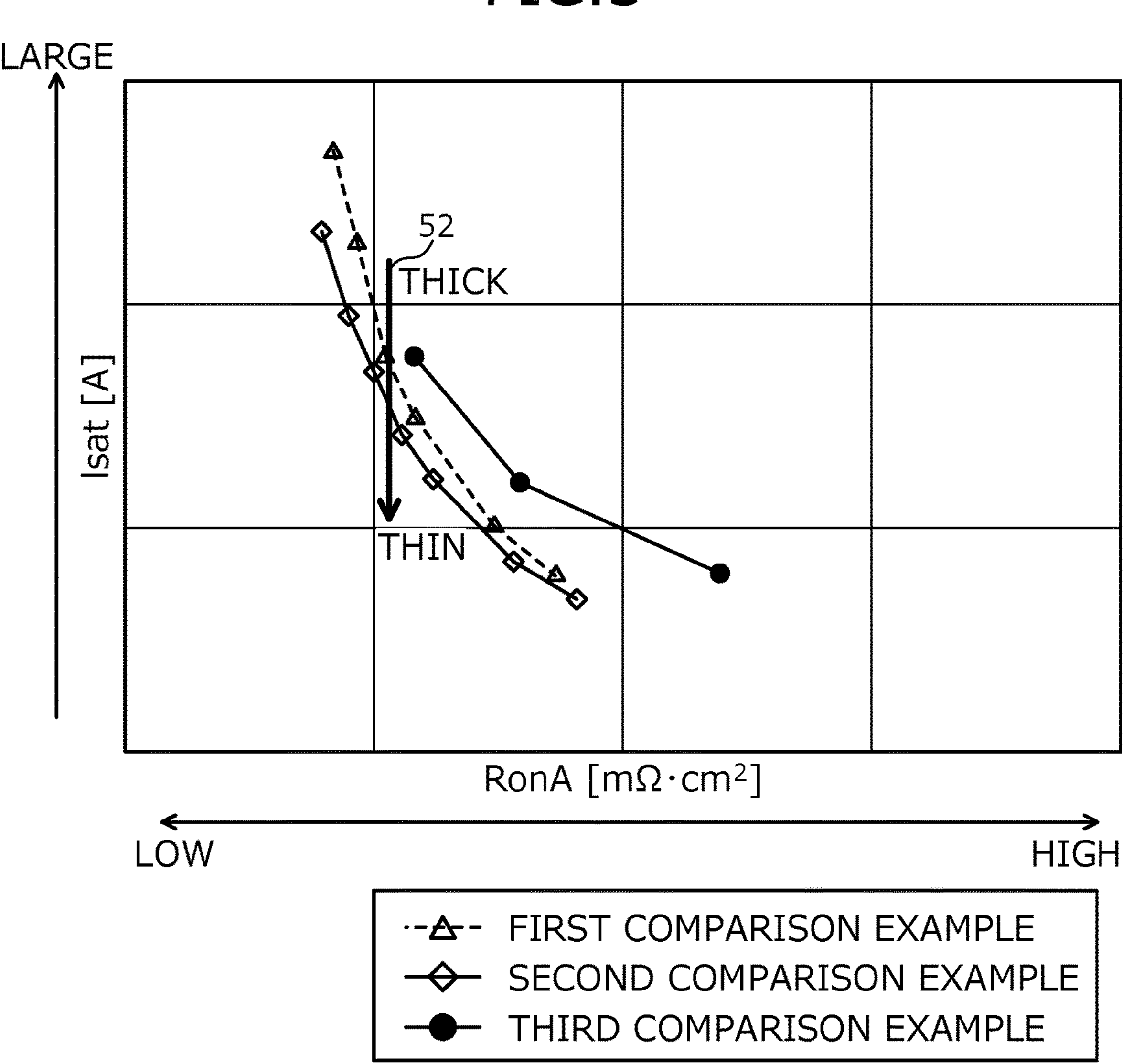
FIG. 3 is a characteristics diagram depicting a relationship between saturation current Isat and on-resistance RonA in the first, second, and third comparison examples.

The thickness t1 of the second JFET region 25 was verified. FIG. 2 is a characteristics diagram depicting output characteristics of first, second, and third comparison examples. FIG. 3 is a characteristics diagram depicting a relationship between the saturation current Isat and the on-resistance RonA in the first, second, and third comparison examples. The first, second, and third comparison examples that obtained by simulation are used as samples of the first experiment example. Results of verification of output characteristics (Ids-Vds characteristics) of the first, second, and third comparison examples are depicted in FIG. 2. In the first, second, and third comparison examples depicted in FIG. 2, only the thickness t101 of the second JFET region 125 differs. Results of verifying the saturation current Isat and the on-resistance RonA by variously changing the impurity concentration of the JFET region 123 in each of the first, second, and third comparison examples are depicted in FIG. 3.

In a SiC-MOSFET (hereinafter, simply "reference example") having the configuration of the silicon carbide semiconductor device 110 of the reference example, a predetermined short-circuit withstand capability is obtained by reducing the impurity concentration of the JFET region 123. In the reference example, the thickness t101 of the second JFET region 125 is assumed to be 0.5 μm and the overhang length d101 of the $p^+$-type region 121 is assumed to be 0.1 μm. The first comparison example differs from the reference example in that the JFET region 123 has an impurity concentration that is within a same range as that of the JFET region 23 of the embodiment. In the second and third comparison examples, the thickness t101 of the second JFET region 125 differs from that of the first comparison example and the respective thicknesses t101 of the respective second JFET regions 125 are 0.3 μm and 0.2 μm.

From the results of the first, second, and third comparison examples depicted in FIG. 2, it was confirmed that the thinner is the thickness t101 of the second JFET region 125, the smaller is the saturation current Isat (the drain-source current Ids in the saturation region) (portion indicated by arrow 51). It was confirmed that by reducing the saturation current Isat, the output characteristics in the saturation region become nearly flat. Further, it was confirmed that when the thickness t101 of the second JFET region 125 is excessively thin as in the third comparison example, the on-resistance RonA rapidly increases. The slope (=the drain-source current Ids/the drain-source voltage Vds) of the output characteristics in a linear region corresponds to a reciprocal of the on-resistance RonA.

From the results depicted in FIG. 3, it was confirmed that in the first, second, and third comparison examples, the impurity concentration of the JFET region 123 is increased, whereby the on-resistance RonA is reduced. In the first and second comparison examples, it was confirmed that while the saturation current Isat is reduced by decreasing the thickness t101 of the second JFET region 125, the on-resistance RonA does not change substantially (portion indicated by arrow 52).

While the on-resistance RonA rapidly increases when the thickness t101 of the second JFET region 125 is excessively thin as in the third comparison example, from the results depicted in FIGS. 2, 3, and later-described FIG. 5, it is presumed that when the thickness t101 of the second JFET region 125 is at least 0.25 μm (preferably, about 0.3 μm±10%), the saturation current Isat may be decreased while maintaining the on-resistance RonA as it is. Thus, it is presumed that when the thickness t101 of the second JFET region 125 is at least about 0.25 μm, the on-resistance RonA is determined according to the impurity concentration of the second JFET region 125 and is independent of the thickness t101 of the second JFET region 125.

The overhang length d1 of the $p^+$-type regions 21 was verified. FIG. 4 is a characteristics diagram depicting the output characteristics of sixth, seventh, eighth, and ninth comparison examples. FIG. 5 is a characteristics diagram depicting a relationship between the saturation current Isat and the on-resistance RonA in fourth to eighth comparison examples. The fourth to ninth comparison examples obtained by simulation are used as samples of a second experimental example. Results of verification of output characteristics of the sixth to ninth comparison examples are depicted in FIG. 4. In the sixth to ninth comparison examples in FIG. 4, only the overhang length d1 of the $p^+$-type regions 21 are different from one another. In the fourth to eighth comparison examples, the saturation current Isat and the on-resistance RonA were verified by variously changing the respective impurity concentrations of the respective JFET regions 23, 123 and the verification results are depicted in FIG. 5.

The sixth to ninth comparison examples are each a SiC-MOSFET having a configuration of the silicon carbide semiconductor device 10 according to the embodiment (refer to FIG. 1) and the thickness t1 of the second JFET region 25 was set to be not more than the overhang length d1 of the $p^+$-type regions 21. In each of the sixth to ninth comparison examples, the thickness t1 of the second JFET region 25 was set to be 0.3 μm. In the sixth to ninth comparison examples, the overhang length d1 of the $p^+$-type regions 21 was set to be 0.15 μm, 0.25 μm, 0.35 μm, and 0.45 μm, respectively. The fifth comparison example differs from the sixth comparison example in that the overhang length d1 of the $p^+$-type regions 21 was set to 0.05 μm. The fourth comparison example differs from the fifth comparison example in that the thickness t1 of the second JFET region 25 was set to be 0.5 μm.

Figure 4:
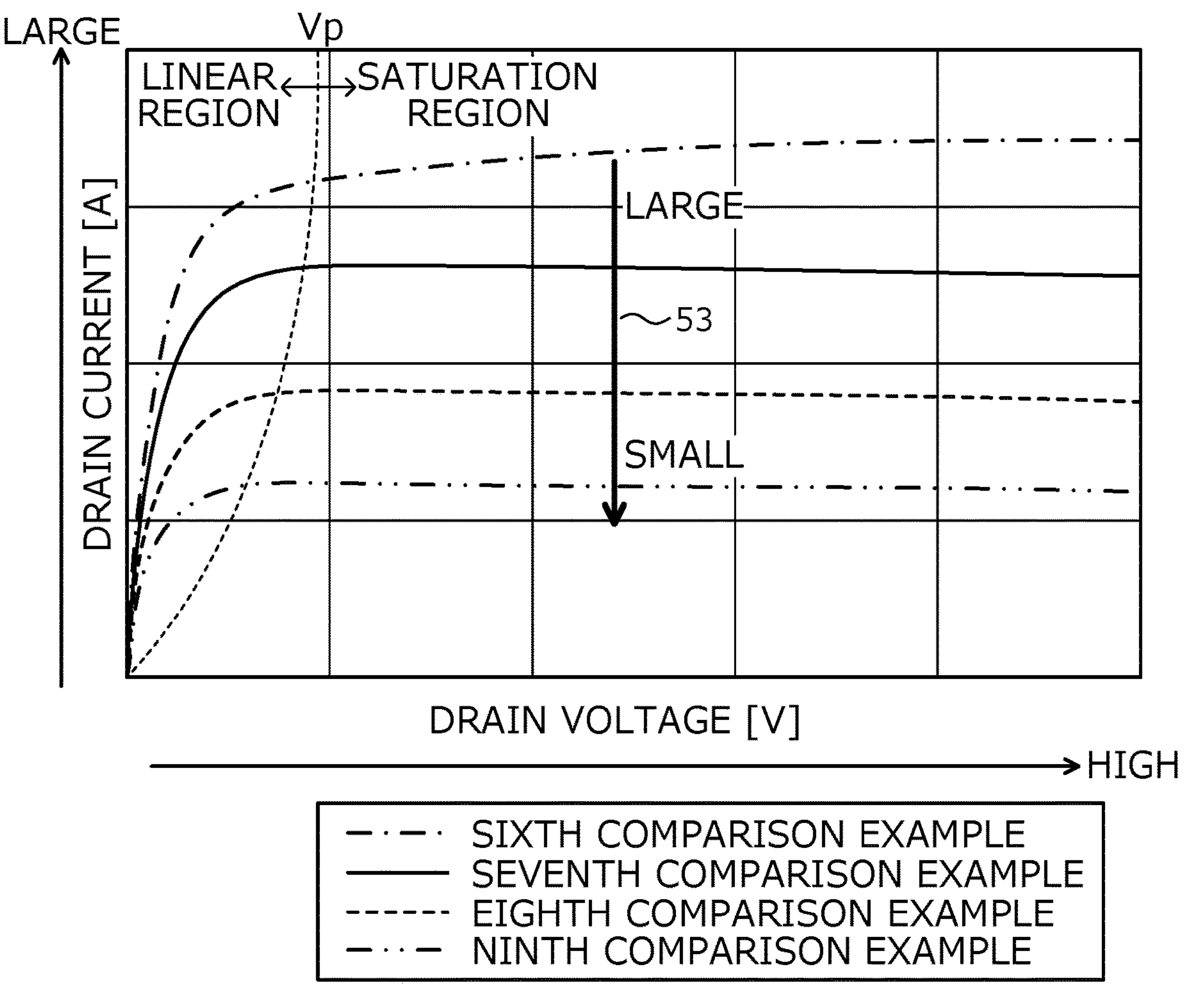
FIG. 4 is a characteristics diagram depicting output characteristics of sixth, seventh, eighth, and ninth comparison examples.
Figure 5:
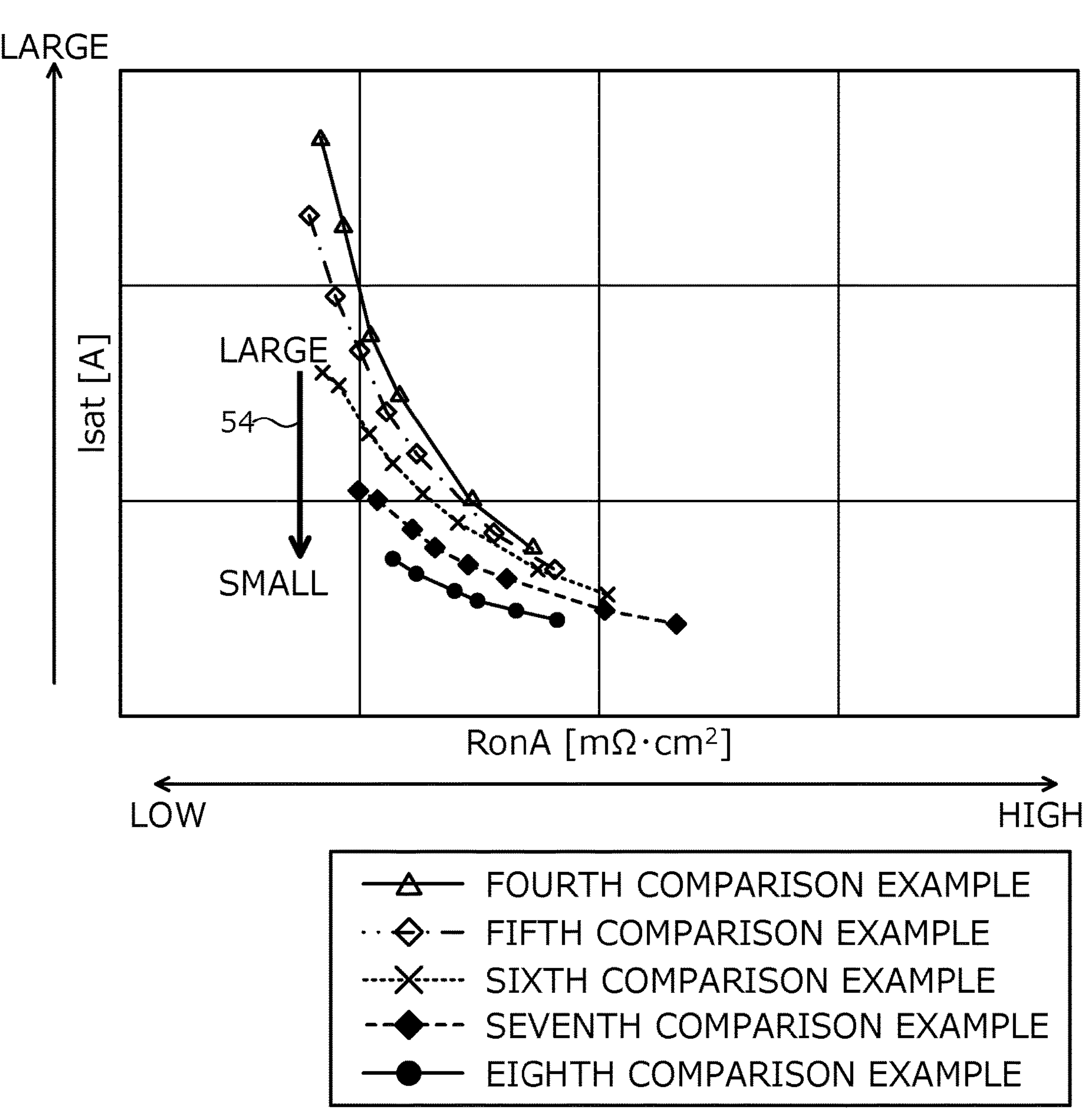
FIG. 5 is a characteristics diagram depicting a relationship between the saturation current Isat and the on-resistance RonA in fourth to eighth comparison examples.

From the results depicted in FIGS. 4 and 5, it was confirmed that the longer is the overhang length d1 of the $p^+$-type regions 21, the greater the short-channel effects are suppressed and the smaller the saturation current Isat (the drain-source current Ids in the saturation region) becomes with the on-resistance RonA being maintained as it is (portions indicated by arrows 53, 54). Further, from the results depicted in FIG. 4, it was confirmed that the longer is the overhang length d1 of the $p^+$-type regions 21 and the smaller is the saturation current Isat, the flatter the output characteristics in the saturation region may be made. A slope (=the drain-source current Ids/the drain-source voltage Vds) of output characteristics in a linear region corresponds to the reciprocal of the on-resistance RonA.

Further, in an instance in which the overhang length d1 of the $p^+$-type regions 21 is the same as that in the fourth and fifth comparison examples and the first experiment example described above, as described above, the thinner is the thickness t1 of the second JFET region 25, the smaller is the saturation current Isat. Further, in an instance in which the thickness t1 of the second JFET region 25 is the same as that in the fifth to ninth comparison examples, as described above, the longer is the overhang length d1 of the $p^+$-type regions 21, the smaller is the saturation current Isat. Therefore, it was confirmed that in the second experimental example, the effect of suppressing the short-channel effects by increasing the overhang length d1 of the $p^+$-type regions 21 and decreasing the thickness t1 of the second JFET region 25 may be increased.

The inventor confirmed that in an instance in which the thickness t1 of the second JFET region 25 is 0.5 μm, even when the overhang length d1 of the $p^+$-type regions 21 is changed, the effect of reducing the short-channel effects is not obtained. Therefore, from the results of the fourth and fifth comparison examples and the first experiment example, it is presumed that the thickness t1 of the second JFET region 25 is preferably in a range of about 0.25 μm to 0.4 μm (more preferably, about 0.3 μm±10%). Further, from the results of the fifth to ninth comparison examples, it is presumed that the overhang length d1 of the $p^+$-type regions 21 is preferably in a range of about 0.25 μm to 0.4 μm (more preferably, about 0.3 μm±10%).

Thus, from the results of the first and second experiment examples, it was confirmed that when the thickness t1 of the second JFET region 25 is set to be not more than the overhang length d1 of the $p^+$-type regions 21, the thinner is the thickness t1 of the second JFET region 25 and the longer is the overhang length d1 of the $p^+$-type regions 21 with the on-resistance RonA, which is due to and determined by the impurity concentration of the second JFET region 25, being maintained as it is, the greater is the suppression of the short-channel effects and the greater the saturation current Isat may be reduced.

In the foregoing, the present invention is not limited to the described embodiments and may be variously modified within a range not departing from the spirit of the invention. Further, in the embodiments, while the first conductivity type is assumed to be an n-type and a second conductivity type is assumed to be a p-type, the present invention is similarly implemented when the first conductivity type is a p-type and the second conductivity type is an n-type.

According to the invention described above, increases in the potential of the end of the inversion layer facing the second main surface are suppressed, short-channel effects are suppressed, and the saturation current may be reduced, whereby the short-circuit withstand capability may be increased.

The silicon carbide semiconductor device according to the present invention achieves an effect in that the tradeoff relationship between the on-resistance and the short-circuit withstand capability may be improved.

As described above, the silicon carbide semiconductor device according to the present invention is useful for power semiconductor devices used in power converting equipment, power source devices of various types of industrial machines, etc. and is particularly suitable for silicon carbide semiconductor devices in which the on-resistance is about 2.5 mΩ·cm$^2$ or less (for example, in a range of about 1.5 mΩ·cm$^2$ to 2.0 mΩ·cm$^2$).

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:

a semiconductor substrate containing silicon carbide and having a first main surface and a second main surface opposite to each other;

a first semiconductor region of a first conductivity type, provided in the semiconductor substrate;

a second semiconductor region of a second conductivity type, provided between the first main surface of the semiconductor substrate and the first semiconductor region;

a third semiconductor region of the first conductivity type, selectively provided between the first main surface and the second semiconductor region;

a trench penetrating through the third semiconductor region and the second semiconductor region in a depth direction of the device;

a gate electrode provided in the trench via a gate insulating film;

a plurality of high-concentration regions of the second conductivity type, selectively provided between the second semiconductor region and the first semiconductor region, at positions closer to the second main surface than is a bottom of the trench, each of the plurality of high-concentration regions having an impurity concentration higher than an impurity concentration of the second semiconductor region, a bottom of each of the plurality of high-concentration regions being at a position closer to the second main surface than is a bottom of the trench;

a junction field effect transistor (JFET) region of the first conductivity type, selectively provided between the second semiconductor region and the first semiconductor region, the JFET region being in contact with the first semiconductor region, the second semiconductor region, and the plurality of high-concentration regions, the JFET region having an impurity concentration higher than the impurity concentration of the first semiconductor region, a bottom of the JFET region being at a position closer to the second main surface than is the bottom of the trench;

a first electrode electrically connected to the third semiconductor region, the second semiconductor region, and the plurality of high-concentration regions; and a second electrode provided at the second main surface, wherein the plurality of high-concentration regions include:

a first high-concentration region provided apart from the second semiconductor region and facing the bottom of the trench in the depth direction, and a second high-concentration region in contact with the second semiconductor region and provided apart from the trench and the first high-concentration region, the first high-concentration region extends closer to the second high-concentration region than is a sidewall of the trench in a direction parallel to the first main surface, by an overhang length, the JFET region includes:

a first JFET region provided between and in contact with the first high-concentration region and the second high-concentration region that are adjacent to each other and apart from the sidewall of the trench, and a second JFET region provided between and in contact with the second semiconductor region and the first JFET region, the second JFET region extending from the first JFET region between the second semiconductor region and the first high-concentration region and reaching the sidewall of the trench, and a thickness in the depth direction of the second JFET region is not more than the overhang length of the first high-concentration region.

2. The silicon carbide semiconductor device according to claim 1, wherein the thickness in the depth direction of the second JFET region is less than the overhang length of the first high-concentration region.

3. The silicon carbide semiconductor device according to claim 1, further comprising an inversion layer between the third semiconductor region and the second JFET region in the depth direction, to be formed during conduction in a portion of the second semiconductor region along the sidewall of the trench to constitute a path of a drift current that flows between the first main surface and the second main surface of the semiconductor substrate, the inversion layer being inverted to the first conductivity type, wherein the first high-concentration region and/or the second high-concentration region is positioned on all line segments connecting the second electrode and an end of the inversion layer facing the second main surface.

4. The silicon carbide semiconductor device according to claim 1, further comprising an inversion layer between the third semiconductor region and the second JFET region in the depth direction, to be formed during conduction in a portion of the second semiconductor region along the sidewall of the trench to constitute a path of a drift current that flows between the first main surface and the second main surface of the semiconductor substrate, the inversion layer being inverted to the first conductivity type, wherein at least any one of the first high-concentration region, the second high-concentration region, and a depletion layer that spreads from a pn junction between any one of the plurality of high-concentration regions and the JFET region during the conduction is positioned on all line segments connecting the second electrode and the end of the inversion layer facing the second main surface.

5. The silicon carbide semiconductor device according to claim 1, wherein an expression:

$$\arctan[(d1+t1)/(t1+t2)]<\arctan(d1/t1)$$

is satisfied in which the thickness of the second JFET region is “t1”, a thickness of the first high-concentration region is "t2", the overhang length of the first high-concentration region is "d1", and a width of the first JFET region is "w1".

6. The silicon carbide semiconductor device according to claim 1, wherein the impurity concentration of the JFET region is in a range of $5.0\times10^{16}/cm^3$ to $1.6\times10^{17}/cm^3$.

7. The silicon carbide semiconductor device according to claim 1, wherein the impurity concentration of the JFET region is in a range of $8.0\times10^{16}/cm^3$ to $1.5\times10^{17}/cm^3$.

8. The silicon carbide semiconductor device according to claim 1, wherein the overhang length of the first high-concentration region is in a range of 0.25 μm to 0.4 μm.

9. The silicon carbide semiconductor device according to claim 8, wherein the overhang length of the first high-concentration region is in a range of 0.27 μm to 0.33 μm.

10. The silicon carbide semiconductor device according to claim 8, wherein the thickness of the second JFET region is at least 0.25 μm.

11. The silicon carbide semiconductor device according to claim 10, wherein the thickness of the second JFET region is at least 0.27 μm.

* * * * *